United States Patent
Hall et al.

(10) Patent No.: US 6,982,387 B2
(45) Date of Patent: Jan. 3, 2006

(54) METHOD AND APPARATUS TO ESTABLISH CIRCUIT LAYERS INTERCONNECTIONS

(75) Inventors: Richard R. Hall, Endwell, NY (US); How T. Lin, Vestal, NY (US); Christopher J. Majka, Owego, NY (US); Matthew F. Seward, Windsor, NY (US); Ronald V. Smith, Friendsville, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/884,778

(22) Filed: Jun. 19, 2001

(65) Prior Publication Data

US 2002/0189861 A1 Dec. 19, 2002

(51) Int. Cl.
*H01R 12/04* (2006.01)
*H05K 1/11* (2006.01)

(52) U.S. Cl. ..................... 174/262; 174/263
(58) Field of Classification Search ........ 174/260–266, 174/258; 29/852–853, 830; 361/776–780; 257/712, 723, 787; 438/667
See application file for complete search history.

(56) References Cited

U.S. PATENT DOCUMENTS

| | | | | |
|---|---|---|---|---|
| 3,105,729 A | * | 10/1963 | Rosenthal et al. | 174/262 |
| 3,601,523 A | * | 8/1971 | Arndt | 174/68.5 |
| 4,328,531 A | * | 5/1982 | Nagashima et al. | 361/401 |
| 4,383,363 A | * | 5/1983 | Hayakawa et al. | 29/847 |
| 4,663,497 A | * | 5/1987 | Reimann | 174/68.5 |
| 4,967,314 A | | 10/1990 | Higgins, III | |
| 5,319,159 A | * | 6/1994 | Watanabe et al. | 174/262 |
| 5,440,075 A | * | 8/1995 | Kawakita et al. | 174/261 |
| 5,479,703 A | | 1/1996 | Desai et al. | |
| 5,499,447 A | * | 3/1996 | Murakami | 174/260 |
| 5,590,460 A | * | 1/1997 | DiStefano et al. | 29/830 |
| 5,920,123 A | * | 7/1999 | Moden | 257/774 |
| 6,013,876 A | * | 1/2000 | Caporizzo | 174/262 |
| 6,073,829 A | | 6/2000 | Pienimaa | |
| 6,080,936 A | | 6/2000 | Yamasaki et al. | |
| 6,120,885 A | | 9/2000 | Call et al. | |
| 6,195,883 B1 | * | 3/2001 | Bhatt et al. | 501/32 |
| 6,291,779 B1 | * | 9/2001 | Lubert et al. | 174/265 |
| 6,504,111 B2 | * | 1/2003 | Curcio et al. | 174/264 |
| 6,555,906 B2 | * | 4/2003 | Towle et al. | 257/723 |

FOREIGN PATENT DOCUMENTS

JP 6302959 10/1994

OTHER PUBLICATIONS

Hawley's Condensed Chemical Dictionary, Thirteen Edition, Nov. 14, 1997.*
IBM Technical Disclosure Bulletin, vol. 25, No. 12 May 1983, Insert Expansion Fit Fastener, J.M. Ergler et al., pp. 6570-6573.

* cited by examiner

*Primary Examiner*—Randy W. Gibson
*Assistant Examiner*—Tuan Dinh
(74) *Attorney, Agent, or Firm*—Schmeiser, Olsen & Watts; William H. Steinberg

(57) ABSTRACT

A method and associated structure for forming a conductive path within a laminate. A conductive element is presses into an opening in the laminate such that portion of at least one end of the conductive element extends beyond a surface of the laminate. A compressive pressure is applied to the portion of the at least one end of the conductive element. The compressive pressure applied to the at least one end of the conductive element forms a contact pad extending beyond the surface of the laminate. The conductive element may include an inner element covered by an outer element.

5 Claims, 3 Drawing Sheets

METHOD AND APPARATUS TO ESTABLISH CIRCUIT LAYERS INTERCONNECTIONS

BACKGROUND OF THE INVENTION

1. Technical Field

The present invention relates to a method of embedding a conductive object in a layer of a circuit board.

2. Related Art

A connection between layers of a circuit board is produced by utilizing a conductive paste in a hole or by a plated through hole (PTH). Conductive pastes can create reliability issues. The conductive pastes can chemically degrade and build resistance as the circuit board is repeatedly heated and cooled. Additionally, the PTH consumes valuable space on all of the layers that it passes through.

SUMMARY OF THE INVENTION

A first general aspect of the present invention provides a method comprising:
  providing a laminate with a top surface and a bottom surface and having at least one hole;
  providing a conductive element;
  inserting the conductive element into the at least one hole in the laminate; and
  deforming the conductive element within the at least one hole in the laminate to retain the conductive element within the at least one hole.

A second general aspect of the present invention provides a method comprising:
  embedding a conductive element into a laminate, wherein the conductive element substantially maintains a shape while the laminate deforms to accommodate the conductive element.

A third general aspect of the present invention provides a method comprising:
  providing an opening in a laminate; and
  pressing a conductive element into the opening.

A fourth general aspect of the present invention provides a method comprising:
  providing a plurality of laminates;
  embedding at least one conductive element into each laminate;
  forming a contact pad on each end of each conductive element;
  bonding each laminate together to form a stack; and
  wherein adjoining contact pads press together and form an electrical connection.

A fifth general aspect of the present invention provides a structure comprising:
  a conductive element embedded into a laminate.

BRIEF DESCRIPTION OF THE DRAWINGS

For an understanding of the present invention, reference should be made to the following detailed description taken in connection with the accompanying drawings wherein.

DETAILED DESCRIPTION OF THE INVENTION

Figure 1:
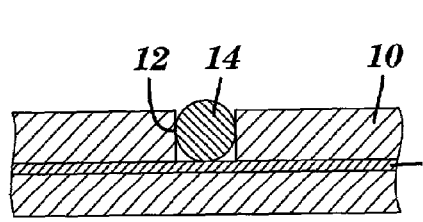
FIG. 1 illustrates a laminate structure including a laminate, a conductive inner plane, an opening and a conductive element.
Figure 2:
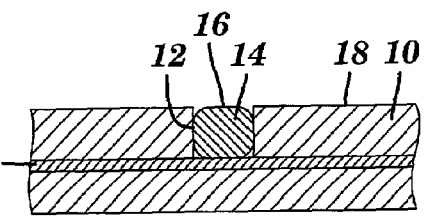
FIG. 2 illustrates a deformed conductive element filling the opening in the laminate.

FIG. 1 illustrates a laminate 10 including an opening 12 and a conductive element 14. The opening 12 may be any suitable shape (e.g., a hole, an oval, a square, etc.). The laminate 10 may comprise any suitable material (e.g., epoxy, cyanate-epoxy blends, glass reinforced carrier, etc.) The conductive element 14 is pressed into the opening 12. The conductive element 14 may comprise any suitable conductive material (e.g., copper, brass, gold, bronze, etc.). The conductive element 14 may be any suitable shape (e.g., sphere, cylinder, etc.). FIG. 1 illustrates the conductive element 14 in the shape of a sphere. The conductive element 14 is pressed into the opening 12 in the laminate 10. The conductive element 14 may deform to fill the opening as illustrated in FIG. 2. Additionally, the opening 12 in the laminate 10 may deform to conform to the shape of the conductive element 14. A conductive inner plane 15C is connected to the outside of the laminate through the conductive element 14. A top surface 16 of the conductive element 14 may deform to be substantially flush with a top surface 18 of the laminate 10 (FIG. 2).

Figure 3:
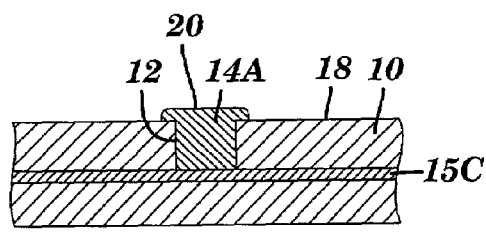
FIG. 3 illustrates another embodiment of a conductive element including an electrode or contact pad of the conductive element formed at a top surface of a laminate and a conductive inner plane.

FIG. 3 illustrates another embodiment of a conductive element 14A pressed into the opening 12 in the laminate 10. The conductive element 14A fills the opening 12 and includes an electrode or contact pad 20 that extends above the top surface 18 of the laminate 10. The conductive inner plane 15C is connected to the outside of laminate 10 through the conductive element 14A.

Figure 4:
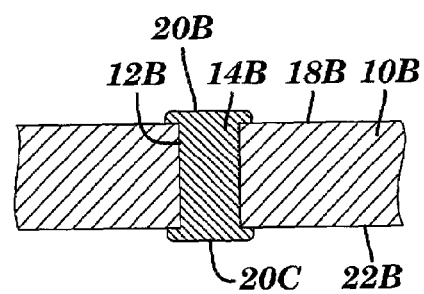
FIG. 4 illustrates another embodiment of a conductive element filling a through hole in a laminate.

FIG. 4 illustrates another embodiment of a conductive element 14B pressed into an opening 12B of a laminate 10B. The opening 12B extends through the laminate 10B from a top surface 18B to a bottom surface 22B of the laminate 10B. The conductive element 14B includes a contact pad 20B extending above the top surface 18B of the laminate 10B. Additionally, the conductive element 14B includes a contact pad 20C that extends below the bottom surface 22B of the laminate 10B.

Figure 5:
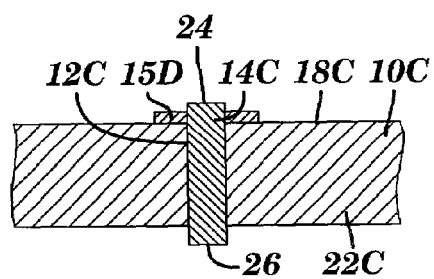
FIG. 5 illustrates another embodiment a conductive element including a cylindrical shape and a conductive inner plane.
Figure 6:
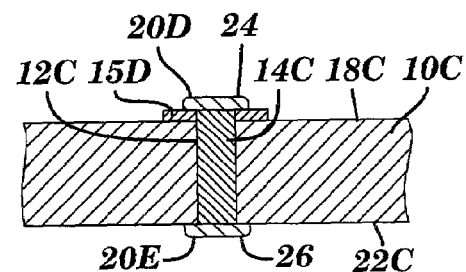
FIG. 6 illustrates the conductive element of FIG. 5 including a contact pad formed on a top surface and a bottom surface of a laminate.

FIG. 5 illustrates another embodiment of a conductive element 14C pressed into an opening 12C of a laminate 10C. The conductive element 14C is cylindrical in shape. The conductive element 14C fills the opening 12C and extends above conductive pad 15D and below a bottom surface 22C of the laminate 10C. A conductive pad 15D is formed on the top surface 18C. Compressive pressure is applied to a top surface 24 and to a bottom surface 26 of the conductive element 14C. The top surface 24 of the conductive element 14C deforms and forms the contact pad 20D as illustrated in FIG. 6. The bottom surface 26 of the conductive element 14C deforms and forms the contact pad 20E. The contact pads 20D and 20E extend beyond the opening 12C and prevent the conductive element 14C from slipping out of the opening 12C in the laminate 10C.

Figure 7:
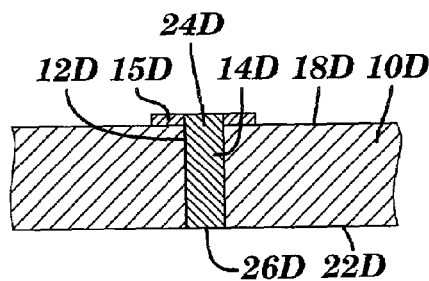
FIG. 7 illustrates another embodiment of a conductive element including a cylindrical element filling a through hole in a laminate.

FIG. 7 illustrates another embodiment of a conductive element 14D pressed into an opening 12D of a laminate 10D. The conductive element 14D is cylindrical in shape. The conductive element 14D may be solid or hollow. A top surface 24D of the conductive element 14D is flush with a top surface of the conductive pad 15D of laminate 10D and a bottom surface 26D of the conductive element 14D is flush with a bottom surface 22D of the laminate 10D.

Figure 8:
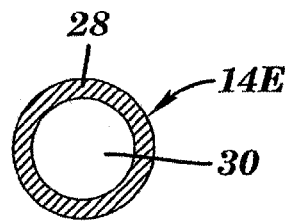
FIG. 8 illustrates another embodiment of a conductive element including a conductive surface covering a base element.

FIG. 8 illustrates another embodiment of a conductive element 14E. The conductive element 14E includes a conductive surface 28 covering a base element 30. The conductive element 14E may include any suitable shape (e.g., sphere, cylinder, oval, etc.). The conductive surface 28 may include any suitable conductive material (e.g., copper, brass, gold, bronze, etc.). The base element 30 may include any suitable material (e.g., glass, rubber, plastic, etc.).

Figure 9:
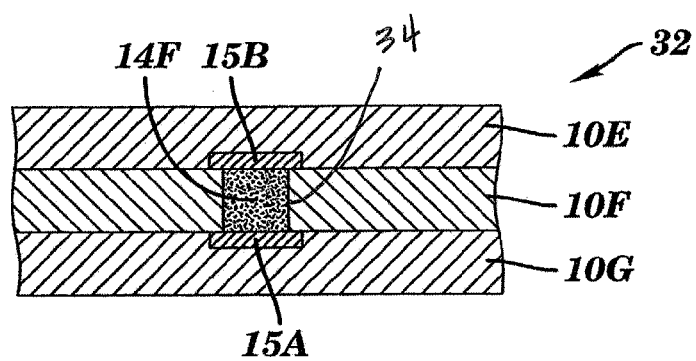
FIG. 9 illustrates another embodiment of a conductive element filling a blind via in a stack of laminates.

FIG. 9 illustrates another embodiment of a conductive element 14F included in a stack 32. The stack 32 includes a plurality of laminates 10E, 10F, 10G and conductive pad or traces 15A and 15B. The stack 32 includes a buried via opening 34. The buried via opening 34 is filled with a conductive element 14F. The stack 32 is formed by drilling the buried via opening 34 in the laminate 10F. The conductive element 14F is pressed into the buried via opening 34. Next, the laminates 10E and 10G are bonded to the laminate 10F forming the stack 32.

Figure 10:
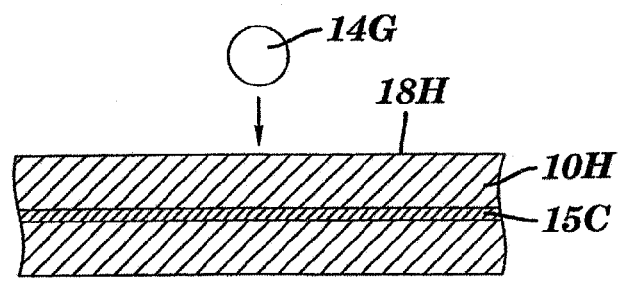
FIG. 10 illustrates another embodiment of a conductive element as the conductive element is projected towards a laminate.
Figure 11:
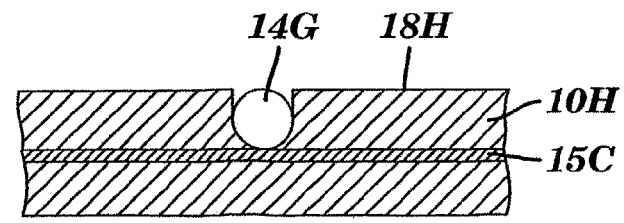
FIG. 11 illustrates the conductive element of FIG. 10 pressed into the laminate of FIG. 10.

FIG. 10 illustrates another embodiment of a conductive element 14G. The conductive element 14G is projected towards the top surface 18H of the laminate 10H. The conductive element 14G impacts the top surface 18H of the laminate 10H and embeds itself into the laminate 10H as illustrated in FIG. 11. Conductive inner plane 15C is connected to the outside of the laminate 10H through conductive element 14G.

Figure 12:
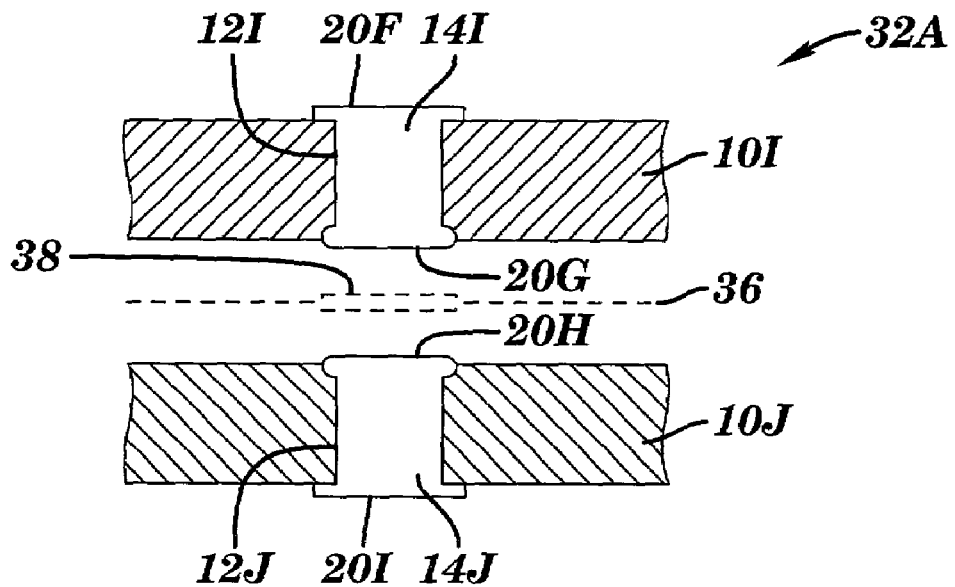
FIG. 12 illustrates stack including a plurality of laminates with each laminate including a conductive element.

FIG. 12 illustrates another embodiment of a stack 32A including a conductive element 14I, a conductive element 14J, a laminate 10I, and a laminate 10J. The conductive element 14I is pressed into an opening 12I in the laminate 10I. In a similar manner as illustrated in FIG. 6, a contact pad 20F and 20G are formed on the conductive element 14I. The conductive element 14J is pressed into an opening 12J in the laminate 10J. A contact pad 20H and 20I are formed in the conductive element 14J. A dielectric bonding layer 36 may be deposited between the laminate 10I and the laminate 10J. The dielectric bonding layer 36 may be deposited by any suitable means (e.g., spraying, coating, screening, etc.). The dielectric bonding layer 36 may be any suitable adhesive (e.g., a partially cured fiberglass reinforced polymer, adhesiveless thermoplastic, polymide film, etc.). Optionally, an electrically conductive adhesive 38 may be deposited between the contact pads 20G and 20H. The electrically conductive adhesive 38 may include any suitable adhesive (e.g., conductive metal filled epoxy, a silver filled thermoset, etc.).

Figure 13:
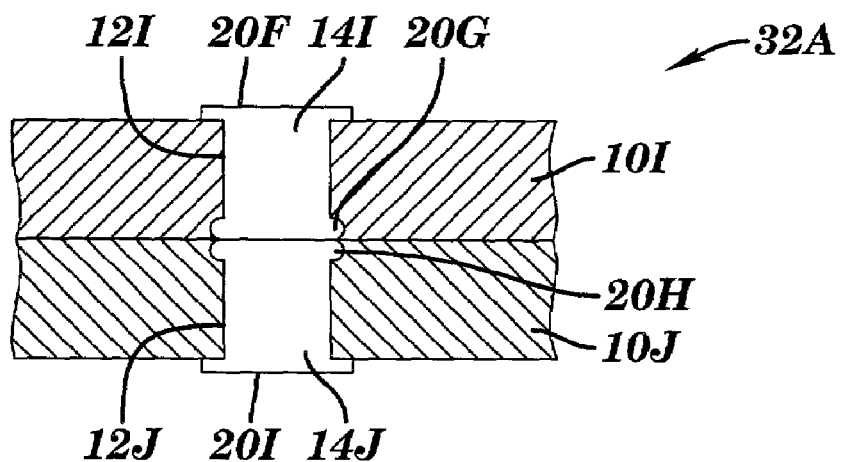
FIG. 13 illustrates the laminates of FIG. 12 forming a stack including having the conductive elements in electrical contact.

FIG. 13 illustrates the assembled stack 32A with the laminate 10I bonded to the laminate 10J and with the contact pads 20G and 20H pressed together in electrical contact.

While embodiments of the present invention have been described herein for purposes of illustration, many modifications and changes will become apparent to those skilled in the art. For example, the conductive element 14 may be any suitable shape (sphere, cylinder, oval, etc.). Additionally the conductive element 14 may be solid or hollow. The conductive element 14 may deform or the laminate 10 may deform, or both the conductive element 14 and the laminate 10 may deform. Accordingly, the appended claims are intended to encompass all such modifications and changes as fall within the true spirit and scope of this invention.

We claim:

1. A method of forming a conductive path within a laminate, comprising:
   providing an opening in the laminate;
   pressing a conductive element into the opening such that a portion of at least one end of the conductive element extends beyond a surface of the laminate; and
   applying a compressive pressure to the portion of the at least one end of the conductive element, wherein the compressive pressure applied to the portion of the at least one end of the conductive element forms a contact pad extending beyond the surface of the laminate, and wherein the conductive element includes an inner element covered by an outer element, wherein the conductive element is a sphere.

2. A structure for interconnection between circuit layers comprising:
   a laminate having a conductive inner plane:
   a conductive pad on a surface of the laminate, wherein a bottom surface of the conductive pad is in direct mechanical contact with the surface of the laminate;
   a conductive element having a lower portion and an upper portion, wherein the lower portion of the conductive element is embedded into the laminate, wherein the upper portion of the conductive element extends above the surface of the laminate, wherein the conductive pad circumscribes the upper portion of the conductive element, wherein the conductive element electrically connects the conductive inner plane to the surface of the laminate, wherein the lower portion of the conductive element comprises a conductive material, and wherein the upper portion of the conductive element comprises the conductive material, wherein a top surface of the conductive pad is coplanar with a top surface of the upper portion of the conductive element.

3. A structure for interconnection between circuit layers, comprising:
   a laminate having a conductive inner plane;
   a conductive pad on a surface of the laminate, wherein a bottom surface of the conductive pad is in direct mechanical contact with the surface of the laminate;
   a conductive element having a lower portion and an upper portion, wherein the lower portion of the conductive element is embedded into the laminate, wherein upper portion of the conductive element extends above the surface of the laminate, wherein the conductive pad circumscribes the upper portion of the conductive element, wherein the conductive element electrically con nects the conductive inner plane to the surface of the laminate, wherein the lower portion of the conductive element comprise a conductive material, and wherein the upper portion of the conductive element comprises the conductive material, wherein part of the upper portion of the conductive element comprises the conductive material, wherein part of the upper portion of the conductive element extends above the conductive pad.

4. The structure of claim 3, wherein the part of the upper portion of the conductive element that extends above the conductive pad is on, and in direct mechanical contact with, a top surface of the conductive pad.

5. The structure of claim 3, wherein the part of the upper portion of the conductive element that extends above the conductive pad is not on a top surface of the conductive pad.

* * * * *

UNITED STATES PATENT AND TRADEMARK OFFICE
CERTIFICATE OF CORRECTION

PATENT NO. : 6,982,387 B2
DATED : January 3, 2006
INVENTOR(S) : Hall et al.

It is certified that error appears in the above-identified patent and that said Letters Patent is hereby corrected as shown below:

Title page,
Item [57], ABSTRACT,
Line 3, delete "that portion" and insert -- that a portion --.

Column 4,
Line 63, delete "wherein upper" and insert -- wherein the upper --.

Signed and Sealed this

Fourteenth Day of March, 2006

JON W. DUDAS
*Director of the United States Patent and Trademark Office*